United States Patent
Ivanov et al.

(10) Patent No.: US 8,810,311 B2
(45) Date of Patent: Aug. 19, 2014

(54) AUTO-ZEROED AMPLIFIER WITH LOW INPUT LEAKAGE

(75) Inventors: Vadim Valerievich Ivanov, Tucson, AZ (US); Brian Phillip Lum-Shue-Chan, Palm Bay, FL (US); Karthik Kadirvel, Melbourne, FL (US)

(73) Assignee: Texas Instruments Incorporated, Dallas, TX (US)

( * ) Notice: Subject to any disclaimer, the term of this patent is extended or adjusted under 35 U.S.C. 154(b) by 40 days.

(21) Appl. No.: 13/557,446

(22) Filed: Jul. 25, 2012

(65) Prior Publication Data

US 2013/0241637 A1 Sep. 19, 2013

Related U.S. Application Data

(60) Provisional application No. 61/610,527, filed on Mar. 14, 2012.

(51) Int. Cl.
*H03F 1/02* (2006.01)

(52) U.S. Cl.
USPC .......................................................... 330/9

(58) Field of Classification Search
USPC ................... 330/9; 327/124, 307, 94, 95, 96
See application file for complete search history.

(56) References Cited

U.S. PATENT DOCUMENTS

| | | | | |
|---|---|---|---|---|
| 4,714,843 A | * | 12/1987 | Smith | 327/91 |
| 5,805,019 A | * | 9/1998 | Shin | 330/9 |
| 6,340,903 B1 | * | 1/2002 | Leith | 327/94 |
| 2008/0186077 A1 | | 8/2008 | Guyton et al. | |

FOREIGN PATENT DOCUMENTS

| | | |
|---|---|---|
| JP | 2001067047 | 3/2001 |
| JP | 2005005620 | 1/2005 |
| JP | 2010028160 | 2/2010 |
| KR | 1020100040581 | 4/2010 |

* cited by examiner

*Primary Examiner* — Steven J Mottola
(74) *Attorney, Agent, or Firm* — Alan A. R. Cooper; Frederick J. Telecky, Jr.

(57) ABSTRACT

An amplifier having an inverting input and a non-inverting input; a capacitor coupled to inverting input of the amplifier; an input voltage conveyance control circuit, having a first switch and a second switch, the first switch coupled to the capacitor, and the second switch coupled to the non-inverting input of the amplifier; a reference voltage conveyance control circuit having a third switch and a fourth switch, a shared node coupled between third switch and fourth switch, the fourth switch coupled to the non-inverting input of the amplifier; a fifth switch coupled to an output of the amplifier; a leakage control circuit having a sixth switch and seventh switch, the sixth switch coupled between the inverting amplifier input and the fifth switch, the seventh switch coupled to the sixth switch and the capacitor; and a first resistor coupled from the output of the amplifier to the first switch.

17 Claims, 3 Drawing Sheets

AUTO-ZEROED AMPLIFIER WITH LOW INPUT LEAKAGE

PRIORITY

This Application claims priority to U.S. Provisional Application No. 61/610,527, filed Mar. 14, 2012, entitled "Auto Zeroed Amplifier with Low Input Leakage", which is incorporated by reference in its entirety.

TECHNICAL FIELD

This Application is directed, in general, to an auto-zeroed amplifier and, more specifically, to an auto-zeroed amplifier with a low leakage into the offset-hold capacitor.

BACKGROUND

FIG. 1 illustrates a prior art auto-zeroed amplifier 100. Generally, auto-zeroed amplifiers are often used to decrease amplifier voltage offset.

In the auto-zeroed amplifier 100, a Vin 105 is coupled to a switch S2 115. The switch S2 115 is coupled to a node 119, which is in turn coupled to a non-inverting input of an amplifier auto-zeroed ("A0") 140. A Vout 180 of the amplifier AO 140 is coupled to a switch S5 170 through a node 181. The switch S5 170 is coupled into an inverting input of the amplifier A0 140 through a node 151.

The node 181 is also coupled to resistor R1 160. The resistor R1 160 is coupled to a node 111, and the node 111 is coupled to a switch S1 110 and a resistor R2 120. The switch S1 110 is coupled to a node 117. The resistor R2 120 is coupled to a node 121, and from the node 121 to a ground 122. The node 121 is also coupled to a negative terminal of a voltage source 130, a positive terminal of which is coupled to a node 131. The node 131 is in turn coupled to a switch S3 133, and also to a switch S4 135. The switch S3 133 is coupled to the switch S1 110 through the node 117, and the switch S4 135 is coupled to the switch S2 115 at a node 119, which is in turn coupled to a non-inverting input of the amplifier A0 140. A capacitor AZ 150 is coupled between the node 117 and the node 151.

The auto-zeroed amplifier 100 can work as follows.

During a phase one ("F1"), the "auto-zero" configuration, the auto-zeroed amplifier 100 is in an "auto-offset" configuration and an offset of amplifier A0 140 is integrated over capacitor AZ 150.

During a phase two ("F2") configuration of auto-zeroing, the "hold" configuration, the capacitor AZ 150 is electrically connected feedback through R1 160, because switch S1 110 is closed. Vin 105 is connected to the non-inverting input of the amplifier A0 140, as switch S2 115 is closed. The offset between the inverting and non-inverting inputs of the amplifier A0 140 is therefore integrated over the capacitor AZ 150. Therefore, the signal Vin is amplified with a higher accuracy as compared to non-offset compensated amplifiers.

However, there are disadvantages with the auto-zeroed amplifier 100. In the auto-zeroed amplifier 100, there is a leakage current through switch S5 170 during "F2", there is a leakage current onto the capacitor AZ 150, thereby changing its voltage, effectively changing the offset of the amplifier 100. The voltage across S5 170, when open during "F2", is equal to the difference between Vin 105 and Vout 180, and can be quite large, causing large leakage current through the switch S5 170. In other words, the amplifier operates as an amplifier during "F2"; however, leakage through switch S5 170 caused by this quite large voltage is a limiting operation time between instances of auto-zeroing periods "F1".

FIG. 2 illustrates a prior art sample/long hold system. A Vin 205 is coupled to a switch S0 210. The switch S0 210 is coupled to a node 212. A switch S1 215 is also coupled to the node 212. A switch S2 220 is also coupled to the node 212, as is its body diode. The switch S1 215 is coupled to a node 217, and the node 217 is coupled to an inverting input of an amplifier A0 230. The node 217 is also coupled to a Vout 235 of the amplifier A0 230. The switch S2 220 is coupled to a node 222. The node 222 is coupled to a capacitor C0 225 and a non-inverting input of the amplifier A0 230. The capacitor C0 225 is also coupled to a ground 227.

The sample/long hold 200 can work as follows.

During a phase "F0", the "sample" configuration, the switch 210, and 220 are closed, which conveys the voltage Vin 205 to both the capacitor C0 225 and the non-inverting input of the amplifier A0 230. The amplifier A0 230 is a unity gain amplifier, as output 235 is shorted to the inverting input 217.

During a "hold" phase "F0 not", the switch 215 is shut, and the switches S0 210 and S2 220 are open. Voltage drop across switch 220 is equal to the voltage offset of the amplifier A0 (a few milliVolts), hence the ensuring small leakage through this switch and long hold time. However, this is a sample/hold circuit and not directly usable in auto-zeroed amplifier of FIG. 1. This sample and hold circuit avoids the transistor leakage problem of FIG. 1, as it is not an auto-correct circuit, however, therefore, it does not autocorrect.

Therefore, there is a need in the art as understood by the present inventors to combine the auto-zero compensation of FIG. 1 with the sample and hold of FIG. 2 that addresses at least some of the concerns of the usage of the prior art.

SUMMARY

A first aspect provides n apparatus, comprising: an amplifier having an inverting input and a non-inverting input; a capacitor coupled to the inverting input of the amplifier; an input voltage conveyance control circuit, having a first switch and a second switch, the first switch coupled to the capacitor, and the second switch coupled to the non-inverting input of the amplifier; a reference voltage conveyance control circuit having a third switch and a fourth switch, wherein a shared node is coupled between the third switch and the fourth switch, the fourth switch coupled to the non-inverting input of the amplifier; a fifth switch coupled to an output of the amplifier; a leakage control circuit having a sixth switch and a seventh switch, the sixth switch coupled between the inverting amplifier input and the fifth switch, the seventh switch coupled to the sixth switch and the capacitor; and a first resistor coupled from the output of the amplifier to the first switch.

A second aspect provides a system including an auto-zeroed amplifier system having an inverting input and a non-inverting input, the system comprising: a capacitor coupled to the inverting input of the auto-zeroed amplifier; an input voltage conveyance control circuitry, having a first switch and a second switch, the first switch coupled to the capacitor, and the second switch coupled to the non-inverting input of the auto-zeroed amplifier; a reference voltage conveyance control circuit having a third switch and a fourth switch, wherein a shared node is coupled between the third switch and the fourth switch, the fourth switch coupled to the non-inverting input of the amplifier; a fifth switch coupled to the output of the auto-zeroed amplifier; a leakage control circuit comprising a sixth switch and a seventh switch, the sixth switch coupled between the inverting auto-zeroed amplifier and the fifth switch, the seventh switch coupled to the sixth switch and the capacitor; a first resistor coupled from the output of the auto-zeroed amplifier to the first switch; a second resistor coupled from the first resistor to ground; and a voltage source coupled between the ground and the reference voltage conveyance control circuitry, wherein a shared node of the reference voltage conveyance control circuitry is also coupled to a positive output of the reference voltage.

A third aspect provides a system including an auto-zeroed differential amplifier, having an inverting input, a non-inverting input, and a common mode voltage input; the system comprising: a high side auto-zero capacitor coupled to the inverting input of the auto-zeroed amplifier; a low side auto-zeroed capacitor coupled to the inverting input of the auto-zeroed amplifier; high side input voltage conveyance control circuit, having a high side first switch and a high side second switch, the high side first switch coupled to the high side capacitor, and the high side second switch coupled to the non-inverting input of the amplifier; low side input voltage conveyance control circuit, having a low side first switch and a low side second switch, the low side first switch coupled to the low side capacitor, and the low side second switch coupled to the non-inverting input of the amplifier; high side reference voltage conveyance control circuit having a high side third switch and a high side fourth switch, wherein a shared node is coupled between the high side third switch and the high side fourth switch, the high side fourth switch coupled to the inverting input of the amplifier; low side reference voltage conveyance control circuit having a low side third switch and a low side fourth switch, wherein a shared node is coupled between the low side third switch and the low side fourth switch, the fourth switch coupled to the non-inverting input of the amplifier; high side fifth switch coupled to a positive output of the amplifier; low side fifth switch coupled to a negative output of the amplifier; high side leakage control circuit having a high side sixth switch and a high side seventh switch, the high side sixth switch coupled between the inverting amplifier input and the high side fifth switch, the high side seventh switch coupled to the sixth switch and the high side capacitor; and a low side leakage control circuit having a low side sixth switch and a low side seventh switch, the low side sixth switch coupled between the inverting amplifier input and the low side fifth switch, the low side seventh switch coupled to the low side sixth switch and the low side capacitor.

BRIEF DESCRIPTION OF THE DRAWINGS

Reference is now made to the following descriptions.

DETAILED DESCRIPTION

Figure 1:
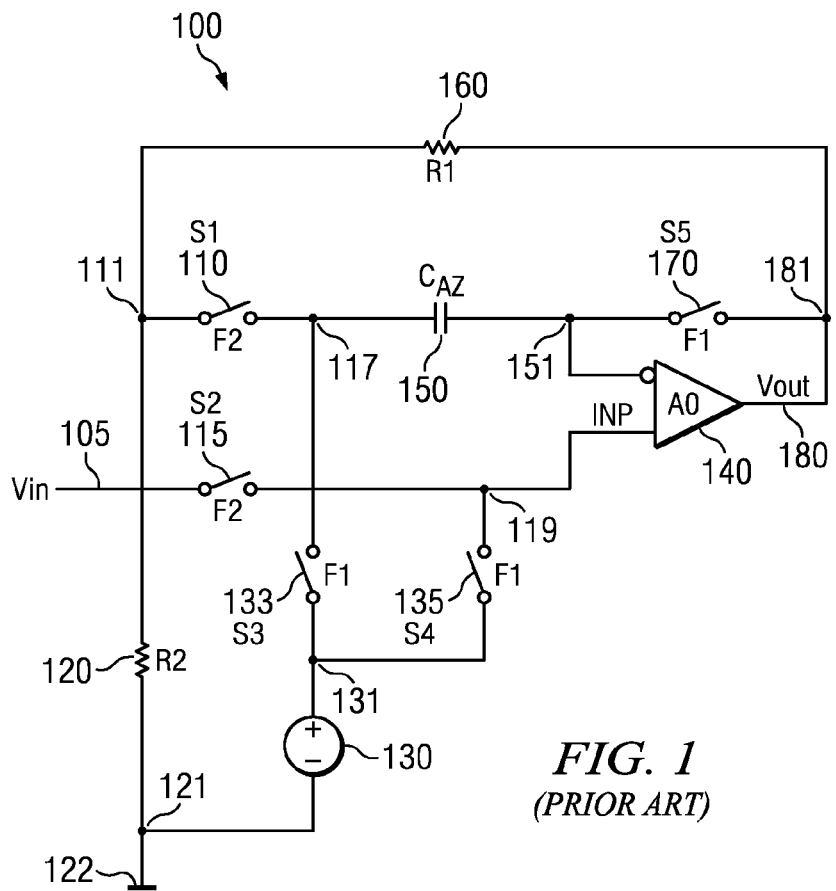
FIG. 1 illustrates a prior art auto-zeroed amplifier 100.
Figure 2:
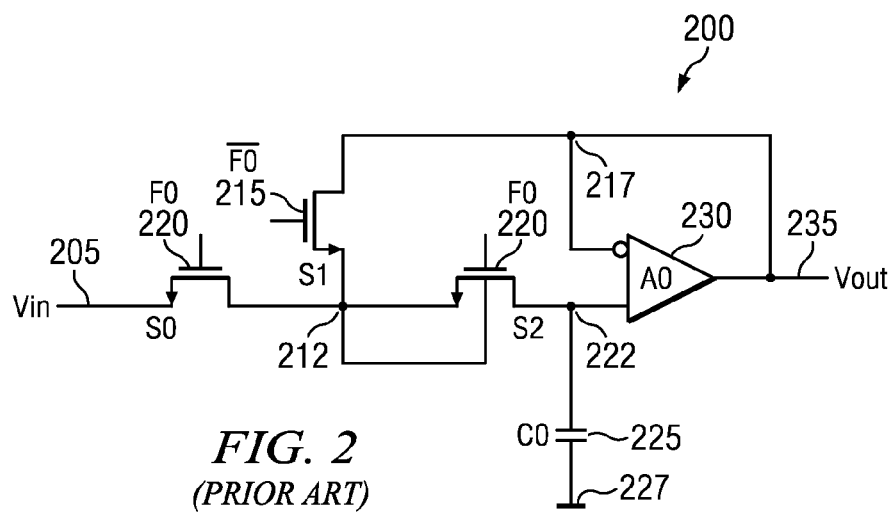
FIG. 2 illustrates a prior art sample and hold amplifier 200.
Figure 3:
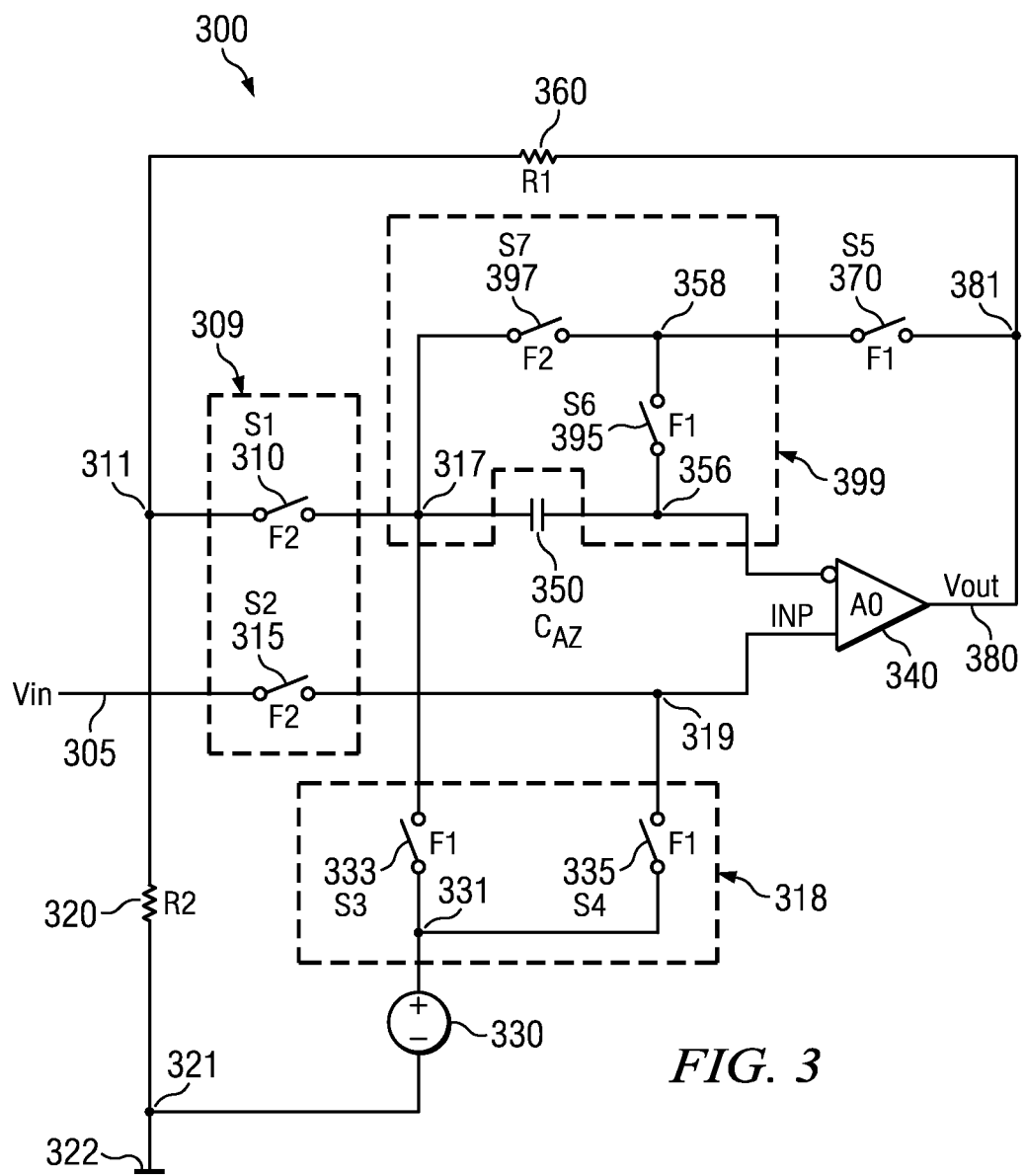
FIG. 3 illustrates an auto-zeroed amplifier with a low leakage current 300 constructed according to principles of the present Application.

Turning to FIG. 3, illustrated is one aspect of an auto-zeroed amplifier with a low leakage current 300 constructed according to principles of the present Application.

Generally, in the auto-zeroed amplifier 300, as shall be discussed below, a voltage across a switch S7 397 of a leakage control circuit 399 is enabled and disabled in inverse phases "F2", "F1" to a coupled switch S6 395 of the leakage control circuit 399, thereby limiting a voltage across the switch S6 395, to a voltage across capacitor AZ 350, thereby substantially reducing the maximum voltage across the switch S6 395 when open. Substantially reducing the maximum voltage across switch S6 395 when open during an "F0" phase, thereby substantially decreases its leakage current to the capacitor AZ 350, thereby substantially increasing operating parameters of an F0 operation time.

The auto-zeroed amplifier 300, a band gap amplifier, allows for a significant increase in length of an "F0" on time, when compared to the prior art amplifiers 100 and 200, which can be from 10's of us to 10's of ms In the auto-zeroed amplifier 300, a Vin 305 is coupled to a switch S2 315. The switch S2 315 is coupled to a node 319, which is in turn coupled to non-inverting input of an auto-zeroed amplifier 340. A Vout 380 of the auto-zeroed amplifier 380 is coupled to a switch S5 370 through a node 381. The switch S5 370 is coupled into a leakage control circuit 399. The various switches of the auto-zeroed amplifier 300 can be, for example, PMOS switches.

The leakage control circuit 399 includes a node 358 coupled to the switch S5 370. The node 358 is also coupled to a switch S7 397 within the leakage control circuit 399. The switch S7 397 is coupled to a node 317. The switch S6 395, also within the leakage control circuit 399, is coupled to a node 356. The nodes 317 and 356 are coupled to the capacitor AZ 350, which is used for integration of offset of amplifier 300 during F0.

The node 381 is also coupled to a feedback resistor R1 360. The feedback resistor R1 360 is coupled to a node 311, the node 311 is coupled to both a switch S1 310 of an input voltage conveyance control circuit 309 and a resistor R2 320. The switch S1 310 is coupled to the node 317. The resistor R2 320 is coupled to a node 321, and from a node 321 to a ground 322. The node 321 is also coupled to a negative terminal of a voltage source 330, a positive terminal of which is coupled to a node 331 of a reference voltage control circuit 318. The node 331 is, in turn, coupled to a switch S3 333, and also to a switch S4 335, also in the reference voltage control circuit 318. The switch S 333 is coupled to the node 317, and the switch S4 335 is coupled to the node 319.

Generally, the voltage across the capacitor AZ 350 is substantially equal to the amplifier A0 offset. Consequently, the voltage across switch S6 395 is also substantially equal to the A) offset, thereby decreasing leakage through the switch S6 395, and therefore substantially increasing hold time between auto-zeroing periods. The offfset can be 0-5 mV.

The auto-zeroed amplifier 300 can work as follows.

During a phase one ("F1"), the auto-zeroed amplifier 300 is in an "auto-zero" configuration, and the offset of amplifier A0 340 is integrated over the capacitor AZ 150. The switches S3 333 and S4 335 are closed, and therefore convey the reference voltage 330 to the nodes 317 and 319, respectively. An offset of the amplifier A0 340 is integrated over the capacitor AZ 350. The switch S5 370 and switch S6 395 are closed, thereby inverting the value of the output Vout 380 to a single feedback of substantially unity gain.

During a phase two ("F2"), a "low-leakage hold phase" configuration, the capacitor AZ 350 is connected in series with the inverting input, as switch S2 315 is closed, Vin 305 is connected to the non-inverting input of the amplifier A0 340, as the switch S2 315 is closed. The offset between the inverting and non-inverting inputs of the amplifier A0 340 is therefore integrated over the capacitor AZ 350.

Moreover, in the auto-zeroed amplifier 300, the switch S7 397 is also closed during "F2", the "low leakage hold phase"

configuration. Because of the closing of switch S7 397 during "F2", during "F2" the voltage across the closed switch S7 397 is therefore coupled in parallel to the capacitor AZ 350 and the open S6 switch 395, which therefore applies a limit of a low maximum ceiling of voltage to open switch S6 395. Therefore, only a few milli-volts or micro-volts will typically be applied across the switch S6 395 during "F2", as opposed to prior art switches of the auto-zeroed amplifier 100 wherein a difference across a switch is the difference between an output of the amplifier A0 140 and an inverting input node of the amplifier A0 140, thereby significantly decreasing the voltage across open switch S6 395 as compared to the voltage across the prior art S6 170 also opened during "F2" phase.

This, in turn, allows for a significantly lowered leakage current to the capacitor AZ 350, thereby increasing usage time. Advantageously, limiting the voltage across the switch S6 370 in this circuit when this switch is open changes limits its leakage current, thereby improving functionality of the auto-zeroed amplifier 300.

Figure 4:
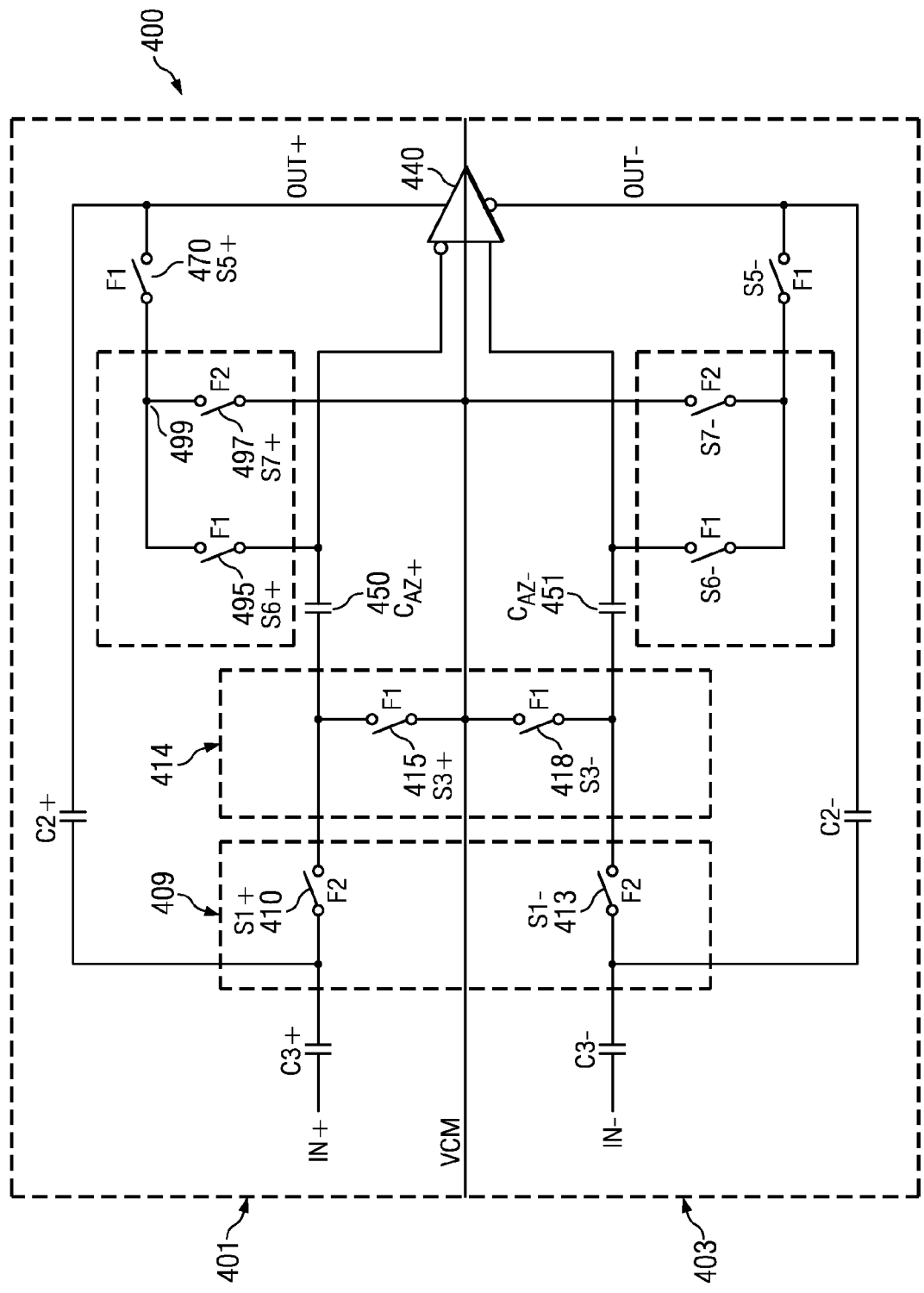
FIG. 4 illustrates a differential auto-zeroed amplifier with a low leakage current 400 constructed according to principles of the present Application.

FIG. 4 illustrates a differential auto-zeroed amplifier 400. Principles of construction and operation of the auto-zeroed amplifier 400 are generally analogous to those of the auto-zeroed amplifier 300, except that the auto-zeroed amplifier 300 is a single-ended amplifier, and the auto-zeroed amplifier 400 is a differential amplifier. As is illustrated, a positive differential side 401 is mirrored in a negative differential side 403. The "F1" and "F2" phases of the positive differential side 401 can be applied by analogy to the negative differential side 403.

During phase "F1", a "differential auto zero" configuration of the differential auto-zeroed amplifier 400, the capacitors AZ 450, 451 are electrically connected between the VCM (input common mode voltage or ground or reference) and amplifier A0 440 out+ and amplifier A0 440 out− through a third high side switch S3 415 and a third low side switch 418 of a differential voltage reference conveyance circuit 414. In the auto-zeroed amplifier 400 the conveyed reference voltage is the common mode voltage. Offsets of the inverting and non-inverting inputs of the amplifier A0 440 are integrated across are integrated across the capacitors AZ 450, 451. C2+, C2−? Can have a few pF value for small die area.

During the phase "F2", a "differential hold" configuration of the differential auto-zeroed amplifier 400, the voltage across open switch s6+ 495 of an upper side leakage control circuit 499 is shorted in parallel thereby limiting the voltages across these open switches S6+ 495 and S6−, for an active phase, thereby decreasing leakage current into the capacitor AZ+ 450 and the capacitor AZ− 451. Switches are shown as closed/open according to phases.

Those skilled in the art to which this application relates will appreciate that other and further additions, deletions, substitutions and modifications may be made to the described embodiments.

What is claimed is:

1. An apparatus, comprising:
   an amplifier having an inverting input and a non-inverting input;
   a capacitor coupled to the inverting input of the amplifier;
   an input voltage conveyance control circuit, having a first switch and a second switch, the first switch coupled to the capacitor, and the second switch coupled to the non-inverting input of the amplifier;
   a reference voltage conveyance control circuit having a third switch and a fourth switch, wherein a shared node is coupled between the third switch and the fourth switch, the fourth switch coupled to the non-inverting input of the amplifier;
   a fifth switch coupled to an output of the amplifier;
   a leakage control circuit having a sixth switch and a seventh switch, the sixth switch coupled between the inverting amplifier input and the fifth switch, the seventh switch coupled to the sixth switch and the capacitor; and
   a first resistor, coupled from the output of the amplifier to the first switch, wherein the first resistor is a feedback resistor.

2. The apparatus of claim 1, wherein the shared node of the input voltage conveyance control circuit is also coupled to a positive output of a reference voltage.

3. The apparatus of claim 1, wherein the sixth switch when open, has a voltage that is substantially equal to a sum of the closed switch voltage of the seventh switch and the capacitor voltage.

4. The apparatus of claim 3, wherein a voltage across the capacitor has bled into it a current that is proportional to the voltage across the sixth switch when open, voltage that is substantially equal to the closed switch voltage of the seventh switch summed to the capacitor voltage.

5. The apparatus of claim 1, further comprising wherein the first and second switches of the input conveyance control circuitry are opposite in logic state from the third and fourth switches of the reference voltage conveyance control circuitry, and wherein the sixth switch of the leakage control circuit are in a same logic state as the reference voltage conveyance control circuitry, and the seventh switch of the leakage control circuit is in a same logic state as the input voltage conveyance control circuitry.

6. The apparatus of claim 1, further comprising a second resistor coupled to the first resistor, the second resistor also coupled to a ground.

7. A system including an auto-zeroed amplifier system having an inverting input and a non-inverting input, the system comprising:
   a capacitor coupled to the inverting input of the auto-zeroed amplifier;
   an input voltage conveyance control circuitry, having a first switch and a second switch, the first switch coupled to the capacitor, and the second switch coupled to the non-inverting input of the auto-zeroed amplifier;
   a reference voltage conveyance control circuit having a third switch and a fourth switch, wherein a shared node is coupled between the third switch and the fourth switch, the fourth switch coupled to the non-inverting input of the amplifier;
   a fifth switch coupled to the output of the auto-zeroed amplifier;
   a leakage control circuit comprising a sixth switch and a seventh switch, the sixth switch coupled between the inverting auto-zeroed amplifier and the fifth switch, the seventh switch coupled to the sixth switch and the capacitor;
   a first resistor coupled from the output of the auto-zeroed amplifier to the first switch, wherein the first resistor is a feedback resistor;
   a second resistor coupled from the first resistor to ground; and
   a voltage source coupled between the ground and the reference voltage conveyance control circuitry,
   wherein a shared node of the reference voltage conveyance control circuitry is also coupled to a positive output of the reference voltage source.

8. The system of claim 7, further comprising wherein the third, fourth, fifth and sixth switches are in a closed state at a same time, and the first, second, and seventh switches are in an open state at that same time.

9. The system of claim 7, further comprising wherein the third, fourth, fifth and sixth switches are open at a same time, and the first, second and seventh switches are in an open state at that same time.

10. The system of claim 7, wherein the sixth switch when open, has a voltage that is substantially equal to the closed switch voltage of the seventh switch summed with the capacitor voltage.

11. The system of claim 7, wherein a voltage across the capacitor has bled into it a current that is proportional to the voltage cross the sixth switch when open, wherein that voltage that is substantially equal to the closed switch voltage of the seventh switch summed with the voltage of the capacitor.

12. The system of claim 7, wherein the amplifier is a single ended amplifier.

13. A system including an auto-zeroed differential amplifier, having an inverting input, a non-inverting input, and a common mode voltage input; the system comprising:
 a high side auto-zero capacitor coupled to the inverting input of the auto-zeroed amplifier;
 a low side auto-zero capacitor coupled to the inverting input of the auto-zeroed amplifier;
 a high side input voltage conveyance control circuit, having a high side first switch and a high side second switch, the high side first switch coupled to the high side capacitor, and the high side second switch coupled to the non-inverting input of the amplifier;
 a low side input voltage conveyance control circuit, having a low side first switch and a low side second switch, the low side first switch coupled to the low side capacitor, and the low side second switch coupled to the non-inverting input of the amplifier;
 a high side reference voltage conveyance control circuit having a high side third switch and a high side fourth switch, wherein a shared node is coupled between the high side third switch and the high side fourth switch, the high side fourth switch coupled to the inverting input of the amplifier;
 a low side reference voltage conveyance control circuit having a low side third switch and a low side fourth switch, wherein a shared node is coupled between the low side third switch and the low side fourth switch, the fourth switch coupled to the non-inverting input of the amplifier;
 a high side fifth switch coupled to a positive output of the amplifier;
 a low side fifth switch coupled to a negative output of the amplifier;
 a high side leakage control circuit having a high side sixth switch and a high side seventh switch, the high side sixth switch coupled between the inverting amplifier input and the high side fifth switch, the high side seventh switch coupled to the sixth switch and the high side capacitor; and
 a low side leakage control circuit having a low side sixth switch and a low side seventh switch, the low side sixth switch coupled between the inverting amplifier input and the low side fifth switch, the low side seventh switch coupled to the low side sixth switch and the low side capacitor.

14. The system of claim 13, further comprising wherein a second high side capacitor is coupled from the high side output of the amplifier to the first high side switch.

15. The system of claim 13, further comprising:
 a high side third capacitor coupled between the high side first switch and a high side input voltage, and
 a low side third capacitor coupled between the low side first switch and a low side input voltage.

16. The system of claim 13, further comprising wherein the high side sixth switch when open, has a voltage that is substantially equal to the closed switch voltage of the high side seventh switch.

17. The system of claim 16, wherein a voltage across either capacitor has bled into it a current that is proportional to the voltage cross the respective sixth switch when open, a voltage that is substantially equal to the closed switch voltage of the respective seventh switch.

* * * * *